United States Patent [19]
Ward et al.

[11] Patent Number: 5,453,835
[45] Date of Patent: Sep. 26, 1995

[54] MULTICHANNEL ACOUSTO-OPTIC CORRELATOR FOR TIME DELAY COMPUTATION

[75] Inventors: Michael J. Ward, San Pedro, Calif.; Christopher W. Keefer, Dayton, Ohio

[73] Assignee: The United States of America as represented by the Secretary of the Air Force, Washington, D.C.

[21] Appl. No.: 273,446

[22] Filed: Jul. 7, 1994

[51] Int. Cl.⁶ ............................................. G01B 9/02
[52] U.S. Cl. ................................ 356/345; 382/278
[58] Field of Search ............................ 356/345, 349; 382/42

[56] References Cited

U.S. PATENT DOCUMENTS

| | | | |
|---|---|---|---|
| 5,002,395 | 3/1991 | Shah | 356/349 |
| 5,116,126 | 5/1992 | Wang et al. | 356/349 |
| 5,187,543 | 2/1993 | Ebert | 356/349 |
| 5,237,390 | 8/1993 | Chaney | 356/363 |

OTHER PUBLICATIONS

"Multichannel Acousto–Optic Correlator for Time Delay Computation", C. W. Keefer et al, SPIE Proceedings, vol. 2240, Apr. 1994.

*Primary Examiner*—Samuel A. Turner
*Assistant Examiner*—Robert Kim
*Attorney, Agent, or Firm*—Robert L. Nathans; Stanton E. Collier

[57] ABSTRACT

A first signal acousto-optic (AO) cell together with a first signal source for injecting a first signal therein is disclosed along with a second AO cell together with a second signal source for injecting a second signal therein, to be correlated with the first signal. A first plus one diffracted order beam emerges from the first cell and is directed at a second cell to produce second and third plus one diffracted order beams which overlap and which produce an interference pattern that is focused on a photodetector array which determines the degree of correlation between the first and second signals. A Dove prism is employed between the cells to cause the second and third beams at the array to be counter-propagating and to control the spatial frequency of the interference pattern produced by these beams.

20 Claims, 2 Drawing Sheets

MULTICHANNEL ACOUSTO-OPTIC CORRELATOR FOR TIME DELAY COMPUTATION

STATEMENT OF GOVERNMENT INTEREST

The invention described herein may be manufactured and used by or for the Government for governmental purposes without the payment of any royalty thereon.

BACKGROUND OF THE INVENTION

Spectrum analysis is a widely used signal processing technique for gaining information about unknown signals. For programmability and accuracy, digital processing techniques are preferred over analog methods. However for real-time processing of large instantaneous bandwidth signals, analog systems are required for the computationally intensive operations of spectrum analysis. Acousto-optic (AO) based correlators or spectrum correlators are considered to be attractive analog techniques because of their parallel processing capability. Many forms of AO spectrum analyzers have been developed for analog signal processing applications. The different approaches include the AO power spectrum analyzer; the AO in-line time integrating correlator; the interferometric AO spectrum analyzer; and the cascaded AO interferometric architecture.

The major limitation of the power spectrum analyzer is a limited dynamic range of 25–30 dB due to the squaring operation of the instantaneous spectrum of the input waveform at the photodetector array. The in-line time integrating correlator overcomes the dynamic range problems by using a hetrodyne technique at the photodetector array by which provides an output proportional to the magnitude spectrum of the input waveform. The major disadvantage of the in-line correlator architecture is that the spatial frequency of the correlation is fixed with respect to the center frequency of the input signal. The pitch requirement for the photodetector array limits the useful input signal bandwidth of the in-line architecture. The interferometric AO spectrum analyzer uses a spatially and temporally modulated reference beam for generating a fixed spatial frequency at the detector plane while maintaining a high dynamic range for spectrum analysis. The spatial frequency is set by varying the recombination paths between the reference and unknown signal AO inputs in the Mach-Zehnder architecture. The major limitation of this system is that the reference and unknown signals follow widely varying paths in reaching the detector. Thus, the system is extremely sensitive to vibration.

The cascaded interferometric AO architecture overcomes the vibration limitations of the interferometric AO spectrum analyzer by cascading the AO cells such that the reference and signal beam travel along a common path. The interferometric properties of the system are obtained by using two Bragg cells with different acoustic velocities or by interposing a birefringent prism between the two AO cells. The major disadvantage of this approach is the development and use of AO cells with different acoustic velocities or the placement of a prism between the two closely spaced AO cells.

BRIEF SUMMARY OF THE INVENTION

An in-line interferometric time integrating correlator is provided which employs a Dove prism to ensure that the signals to be correlated are counter-propagating in the correlation plane, and which provides a means to control the spatial frequency at the detector array so that the spatial frequency of the interferometric correlation can be matched to the spatial frequency of the photodetector array elements.

BRIEF DESCRIPTION OF THE DRAWINGS

Other features and advantages of the present invention will become apparent upon study of the following description taken in conjunction with the drawings in which.

DETAILED DESCRIPTION OF EMBODIMENTS OF THE INVENTION

Figure 1:
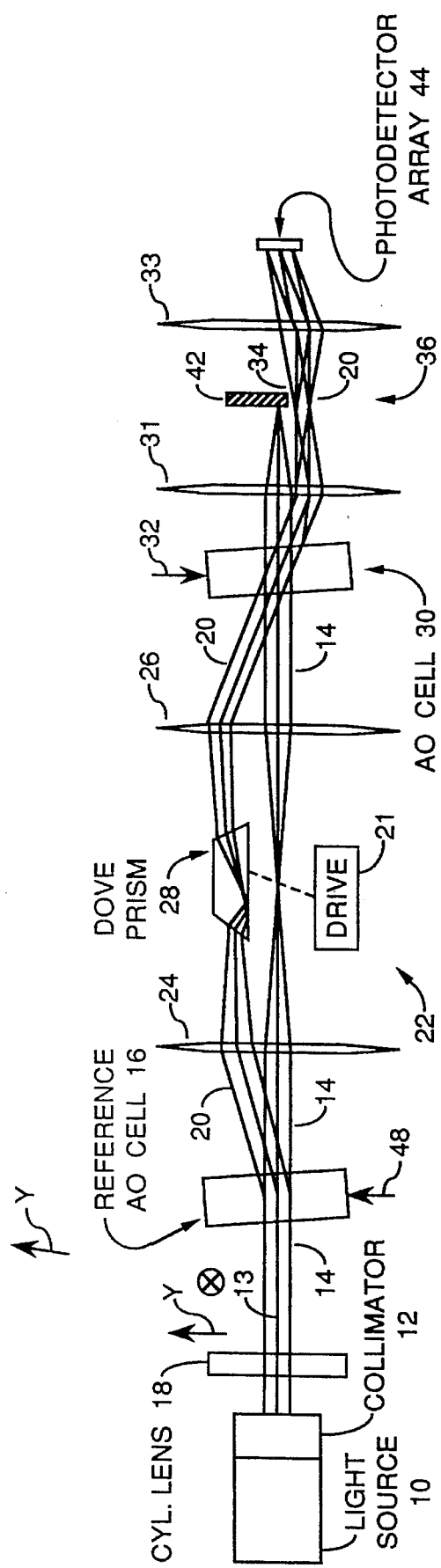
FIG. 1 illustrates a preferred embodiment of the invention.

The features of the in-line, interferometric, time integrating correlator are shown in FIG. 1. The apparatus is made up of a coherent light source 10, collimator 12, cylindrical lens 18, the reference signal AO cell 16, dove prism 28, signal AO cell 30, and the photodetector array 44. Coherent light source 10 accesses the delay window of the reference AO cell 16 which is oriented at the Bragg angle with respect to the light 14 propagated along optical axis 13. The time integrating correlator aspect of the invention consists of imaging the plus one diffracted order 20 from the reference cell 16 onto a second AO cell 30, which is driven by the unknown RF signal 32. Signal AO cell 30 is oriented to satisfy the Bragg condition for the undiffracted light 14 from the reference AO cell 16. The imaging process between the two AO cells ensures that the plus one diffractive order from reference cell 16 overlaps the plus one diffractive order from the signal AO cell 30. These overlapped beams are then imaged onto the photodetector array 44 where the resulting interference is integrated with respect to time. If the unknown RF signal 32 correlates with the reference RF signal 48, then the counter-propagating beams will pass through each other at the same detector elements on array 44 during each cycle of the RF signals. The detector elements in the array collect light for a user defined integration time, during which the consecutive cycling of the correlated RF signals build up light intensity at the array locations where the beams repeatedly overlap each other. If the signals do not correlate with one other, then they will not repeatedly overlap at the same location on array 44 during the integration time, and the detector array will not register increased light intensity at any location without correlation.

Because the photodetector array's element-to-element spacing limits the resolution, the RF signal correlation needs to be imposed on a stationary pattern of interference fringes called a spatial carrier. The interference fringes are created by the constructive and destructive interference of the two plane waves of light from diffracted beams 20 and 34. The spatial separation of the interference fringes, which is a function of the angular separation of the two beams, must be at least twice the detector element spacing of array 44 to ensure that the fringes are resolvable.

Note that the two AO cell light beam deflector signals are counter-propagating due to the RF reference signal input 48 being on the lower portion of reference AO cell 16 and the unknown signal input 32 being on the upper portion of the signal AO cell 30. A first 1:1 imaging lens system 22 comprising lenses 24 and 26, images the aperture of the reference AO cell 16 into AO cell 30 driven by the unknown signal. The first 1:1 imaging system inverts the scan direction of the scanning spot from the first AO cell 16, effectively negating the counter-propogating layout of the two AO cells 16 and 32. However, within this first imaging system, Dove prism 28, placed in the beam path of the plus one diffracted order, performs two critical functions: it inverts the scan direction of beam 20 and provides an angular shift of the same beam.

Figure 2:
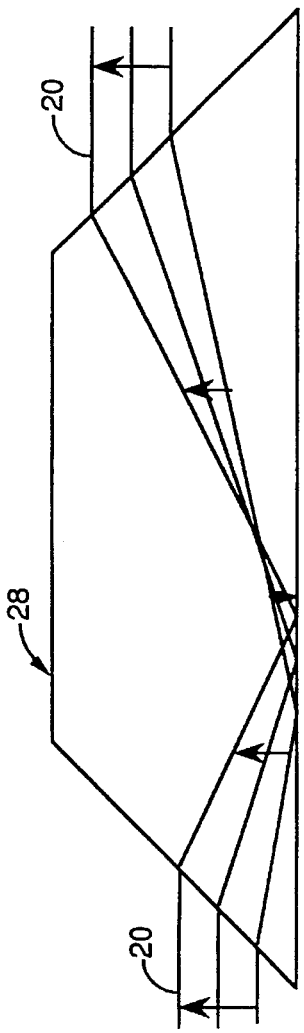
FIG. 2 illustrates use of the Dove prism to cause linear shift of the diffracted order and to invert the scan direction of the optical beam after the focal point.

Dove prism 28 inverts the scan direction of the scanning spot from the first AO cell 16. This function, which is a unique aspect of the present invention, is necessary in order for the scanning spots from the two AO cells to counter-propagate at the photodetector array 44. The scan directions of these two beams must be opposite to one another at the photodetector array 44 in order to mathematically perform the correlation operation. If the propagation of each scan is in the same direction, then all array elements 44 will effectively see the same light intensity which indicates no correlation. The Dove prism 28 inverts the scan direction of beam 20 upon reflection at the lower face of the prism as shown in FIG. 2. This reflection effectively inverts the image inversion about the focal point of beam 20, also as shown in FIG. 2. The DC beam 14 satisfies the Bragg condition for the second AO cell 30. A second lens system comprising lenses 31 and 33, images the plus one diffracted orders from the first and second AO cells upon the photodetector array 44 which could be part of a line scan camera. Spatial filter 42 blocks the undiffracted light. Thus with the Dove prism in the optical system, beams 20 and 34 scan in opposite directions at the photodetector array 44, which mathematically performs the correlation operation.

The second function of the Dove prism 28 is to cause a spatial displacement in the aforesaid y direction of the plus one diffracted order 20 of the first AO cell without affecting the undiffracted order 14. This displacement causes the diffracted order 20 to recombine with the plus one diffracted order 34 at the second AO cell at a slight angular displacement at the photodetector 44. The angular displacement caused by the Dove prism produces linear interference fringes at the photodetector in the same manner as interference fringes are caused by the angular recombination of two coherent plane waves of light. The spatial frequency of the fringes will vary by changing the angular displacement of the two light sources (diffracted orders). The spacing of these fringes can be optimized for the photodetector spacing (optimum sampling of the correlation) by varying the recombination angle of beam 20. The spatial frequency of these fringes can be tuned by translating the prism by means of drive mechanism 21 in a direction transverse to the optical axis 13, thereby changing the recombination angle of the plus one orders at the photodetector. The correlation is formed as the photodetectors integrate the counter-propogating scanning spots over time.

A combination of three mirrors placed in the path of the plus one diffracted order can theoretically perform the same scan direction inversion performed by the Dove prism without changing the direction of the beam as it exits the mirror arrangement. Additionally, an optical wedge inserted in the plus one diffracted order 20 could produce angular displacement. The great advantage of the Dove prism over this approach is the simplicity of providing both functions in one device. Also, mirrors tend to be vibrationally sensitive which reduces the inherent stability advantages of the interferometric design.

Our novel design demonstrates improved vibrational stability, system light efficiency, and dynamic range over a dual-path interferometric correlator. The resulting tunable spatial frequency represents an advantage over the in-line interferometric correlator. We designed and built an optical system to demonstrate the invention. Coherent light source 10 was a ten mWatt HeNe laser at 632.8 nm which was spatially filtered and collimated to 20 mm diameter by beamforming optics 12. A 300 mm plano-cylindrical lens 18 focused the light into AO cell 16 to improve system diffraction efficiency. AO cells 16 and 30, manufactured by the IntraAction Corporation, have a 40 MHz center frequency, a 20 MHz 3 dB bandwidth, a 22 mm spatial aperture, and a five microsecond time aperture. The first 1:1 imaging system consisted of two plano-convex lenses of 300 mm focal length. The first lens 24 has a two inch diameter, and the second lens 26 has a three inch diameter. The DC light 14 and plus one diffractive order 20, generated by reference RF signal 48 on a 40 MHz RF carrier, are focussed into two vertical lines at the focal plane of the first imaging lens 24. At this point, the plus one order 20 passes through Dove prism 28, mounted on translation drive stage 21. The prism base is 0.7 inches in length with a height of 0.5 inches.

Since the Dove prism 28 is placed in the focal plane of imaging lens 26, the spatial displacement induced by the prism results in an angular displacement of the plus one order 20 when it is imaged into the signal AO cell 30. Cell 30 is oriented so as to satisfy the Bragg condition for the incident DC light 14. The RF input into the signal AO cell 30 on a 40 MHz RF carrier produces plus one diffracted order 34 which propogates at a slight angle to the diffracted order 20 from the reference AO cell 16. The undiffracted light from the signal AO cell 30 is blocked by spatial filter 42 at the focal point of the imaging system 36.

Plano-cylindrical lens 18 performs several useful functions. It focuses the collimated beam 14 into a horizontally compresses line at the center of the AO cell 16, thereby improving system diffraction efficiency. As shown in FIG. 1, lens 18 essentially maintains collimation of beam 14 perpendicular to the optical axis as indicated by arrow labelled y, but focuses this beam in the horizontal x direction extending into the plane of the paper, as indicated by the symbol x, thus producing a vertical line in the y direction at the focal plane of lens 24, intersecting the Dove prism. This facilitates the passage of beam 20 through the Dove prism, which is a fairly small optical element. Similarly, beams 14, 20 and 34 focus to a vertical line at the focal plane of lens 37, which facilitates separating beam 14 from 20 and 34 and blocking this beam with the spatial filter 42. Finally, the net effect of lens 18 and the two imaging systems is to image the horizontally compressed beam within AO cell 16 onto the photodetector array 44.

The second 1:1 imaging system 36, consisting of two 2" inch diameter plano-convex lenses 31 and 33 of 150 mm focal length, images the two diffracted beams onto the photodetector array 44. The plano-cylindrical lens 18 causes the light to focus into a horizontal line at the detector plane. Array 44 was an EG&G Reticon LC1901 modular line scan camera with 512 pixels, 26 micrometer pitch. The camera was interfaced to a PC via a Reticon RS 1910 camera controller and a Girard 3197 8-bit interface board.

Figure 3:
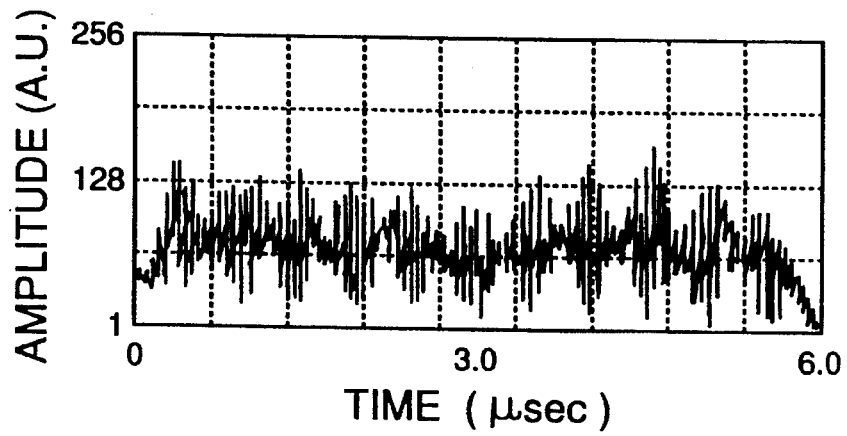
FIGS. 3–5 illustrate waveforms useful in the further understanding of the invention.
Figure 4:
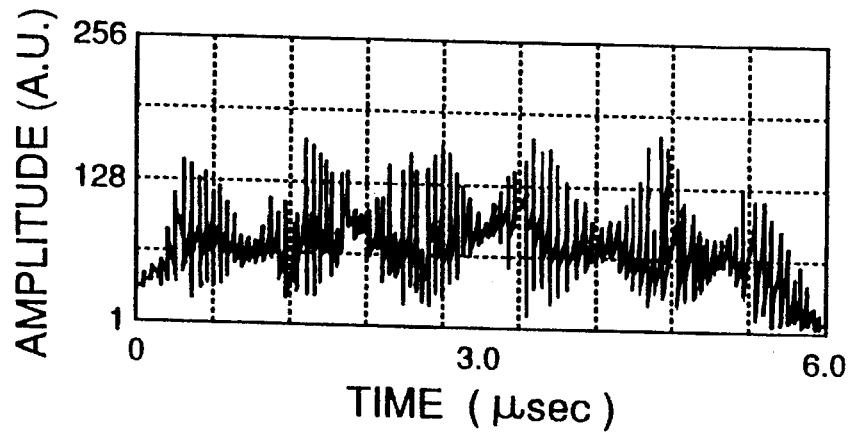

As an initial test signal, we mixed a one MHz sinusoidal modulation with a 40 MHz suppressed carrier. This test signal was used as an input to both AO cells. We expected the autocorrelation to be a 2 MHz modulation (the beat frequency between 39 and 41 MHz sidelobes of the amplitude modulation) of the interferometrically produced spatial frequency. The resulting autocorrelation produced by the linescan camera output is shown in FIG. 3. This data agrees with the expected result. As can be seen there are about eleven repetitions over a five microsecond window which corresponds to two MHz (11 cycles/5.5 microseconds). The sinusoidal modulation was decreased to 500 KHz. Therefore we expected a one MHz modulation of the spatial carrier. The optically computed autocorrelation, shown in FIG. 4, agrees with the expected result.

Figure 5:
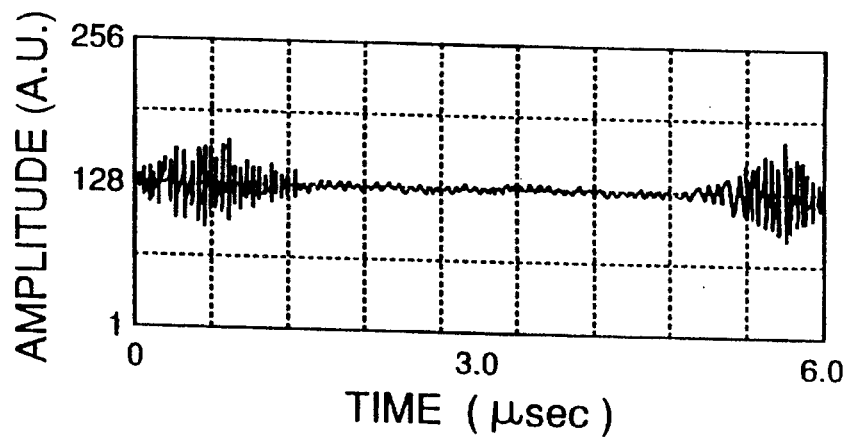

The third test signal used was a one microsecond rectangular pulse modulation at a five microsecond pulse repetition, of a 40 MHz suppressed carrier. We expect the autocorrelation of a one microsecond RECT function to be a TRI function of total width 2 microseconds. The optically computed autocorrelation of this signal, which agrees with the expected result, is shown in FIG. 5.

Other embodiments of the invention will become readily apparent to the skilled workers in the art, and thus the scope of the invention is to be limited solely by the terms of the following claims and art recognized equivalents thereof.

What is claimed is:

1. An in-line interferometric time integrating correlator comprising:

(a) a first reference signal acousto-optic (AO) cell together with a first signal source for injecting a first reference signal therein at a first terminal portion thereof and propagating through said AO cell in a first direction;

(b) a second AO cell together with a second signal source at a second terminal portion thereof, opposite said first terminal portion, for injecting a second signal therein, to be correlated with said first reference signal, and counter-propogating within said second AO cell with respect to the direction of propagation of said first reference signal;

(c) a source of coherent light for directing a light beam along an optical axis and intersecting the first AO cell for producing an undiffracted beam emerging therefrom and a first plus one diffracted order beam exiting said first AO cell;

(d) first imaging means for projecting the first plus one order diffracted beam from the first AO cell upon the second AO cell along with said undiffracted beam for producing second and third overlapping plus one diffracted order beams exiting said second AO cell;

(e) a light integrating photodetector array means;

(f) a second imaging means for imaging the second and third overlapping plus one diffracted order beams upon said photodetector array means, enabling the resulting interference to be integrated by said photodetector array means with respect to a user-defined integration time; and (g) Dove prism means, positioned within said first imaging means, in the path of said first plus one diffracted order beam, for causing the second and third plus one diffracted order beams to overlap upon exiting the second AO cell and scan in opposite directions at the photodetector array.

2. The correlator of claim 1 including a plano-cylindrical lens positioned between said source of coherent light and said first AO cell for focusing a collimated beam into a line at a central portion of said first AO cell.

3. The correlator of claim 1 including means for translating said Dove prism in a direction transverse to said optical axis thereby to change the angle of said overlap of said second and third plus one diffracted order beams.

4. The correlator of claim 2 including means for translating said Dove prism in a direction transverse to said optical axis thereby to change the angle of said overlap of the second and third plus one diffracted order beams.

5. The correlator of claim 1 including a spatial filter positioned within said second imaging system for preventing undiffracted light from reaching said photodetector array.

6. The correlator of claim 2 including a spatial filter positioned within said second imaging system for preventing undiffracted light from reaching said photodetector array.

7. The correlator of claim 3 including a spatial filter positioned within said second imaging system for preventing undiffracted light from reaching said photodetector array.

8. The correlator of claim 4 including a spatial filter positioned within said second imaging system for preventing undiffracted light from reaching said photodetector array.

9. An in-line interferometric time integrating correlator comprising:

(a) a first signal acousto-optic (AO) cell together with a first signal source for injecting a first signal therein;

(b) a second AO cell together with a second signal source for injecting a second signal therein, to be correlated with said first signal;

(c) a source of coherent light for directing a light beam along an optical axis and intersecting the first AO cell for producing an undiffracted beam emerging therefrom and a first plus one order diffracted beam exiting said first AO cell;

(d) first imaging means for projecting the first plus one order diffracted beam from the first AO cell upon the second AO cell along with said undiffracted beam for producing second and third overlapping plus one diffracted order beams exiting said second AO cell;

(e) a light integrating photodetector array means;

(f) a second imaging means for imaging the second and third overlapping plus one diffracted first order beams upon said photodetector array means, enabling the resulting interference to be integrated by said photodetector array means with respect to a user-defined integration time; and (g) Dove prism means, positioned in the path of said first plus one diffracted order beam and co-acting with said first and second imaging means, for causing the second and third plus one diffracted order beams to overlap upon exiting the second AO cell and scan in opposite directions at the photodetector array.

10. The correlator of claim 9 including a plano-cylindrical lens positioned between said source of coherent light and said first AO cell for focusing a collimated beam into a line at a central portion of said first AO cell.

11. The correlator of claim 9 including means for translating said Dove prism in a direction transverse to said optical axis thereby to change the angle of said overlap of said second and third plus one diffracted order beams.

12. The correlator of claim 10 including means for translating said Dove prism in a direction transverse to said optical axis thereby to change the angle of said overlap of the second and third plus one diffracted order beams.

13. The correlator of claim 9 including a spatial filter positioned within said second imaging system for preventing undiffracted light from reaching said photodetector array.

14. The correlator of claim 10 including a spatial filter positioned within said second imaging system for preventing undiffracted light from reaching said photodetector array.

15. The correlator of claim 11 including a spatial filter positioned within said second imaging system for preventing undiffracted light from reaching said photodetector array.

16. The correlator of claim 12 including a spatial filter positioned within said second imaging system for preventing undiffracted light from reaching said photodetector array.

17. An in-line interferometric time integrating correlator comprising:

a) a first signal acousto-optic (AO) cell together with a first RF signal source for injecting a first RF signal therein;

(b) a second AO cell together with a second RF signal source for injecting a second RF signal therein, to be correlated with said first RF signal;

(c) a source of coherent light for directing a coherent light beam at the first AO cell for producing an undiffracted beam emerging therefrom and a first plus one order diffracted beam exiting said first AO cell;

(d) first imaging means for projecting the first plus one order diffracted beam from the first AO cell upon the second AO cell along with said undiffracted beam for producing second and third overlapping plus one diffracted order beams exiting said second AO cell;

(e) a light integrating photodetector array means;

(f) a second imaging means for imaging the second and third overlapping plus one diffracted first order beams upon said photodetector array means, enabling the resulting interference to be integrated by said photodetector array means with respect to a user-defined integration time; and g) Dove prism means, positioned in the path of said first plus one diffracted order beam and co-acting with said first and second imaging means, for causing the second and third plus one diffracted order beams to overlap upon exiting the second AO cell and scan in opposite directions at the photodetector array.

18. The correlator of claim 17 including a plano-cylindrical lens positioned between said source of coherent light and said first AO cell for focusing a collimated beam into a line at a central portion of said first AO cell.

19. The correlator of claim 17 including means for translating said Dove prism in a direction transverse to said optical axis thereby to change the angle of said overlap of said second and third plus one diffracted order beams.

20. The correlator of claim 18 including means for translating said Dove prism in a direction transverse to said optical axis thereby to change the angle of said overlap of the second and third plus one diffracted order beams.

\* \* \* \* \*